United States Patent [19]

Schmoock

[11] 4,234,806

[45] Nov. 18, 1980

[54] MONOSTABLE MULTIVIBRATOR EMPLOYING NONSATURATING SWITCHING TRANSISTOR

[75] Inventor: James C. Schmoock, San Jose, Calif.

[73] Assignee: Raytheon Company, Lexington, Mass.

[21] Appl. No.: 922,397

[22] Filed: Jul. 5, 1978

[51] Int. Cl.³ .......................................... H03K 3/284
[52] U.S. Cl. .................................. 307/273; 307/310; 328/207
[58] Field of Search ............... 307/273, 310, 362, 300; 328/207

[56] References Cited

U.S. PATENT DOCUMENTS

| | | | |
|---|---|---|---|
| 3,048,708 | 8/1962 | Raver | 307/273 |
| 3,480,801 | 11/1969 | Smith | 307/273 X |
| 3,532,993 | 10/1970 | Kennedy | 307/273 X |
| 3,725,681 | 4/1973 | Frederiksen | 307/273 |
| 3,742,257 | 6/1973 | Wittenzellner | 307/273 |
| 3,867,651 | 2/1975 | Wojslawowicz | 307/273 |

Primary Examiner—John Zazworsky
Attorney, Agent, or Firm—Richard M. Sharkansky; Joseph D. Pannone

[57] ABSTRACT

A voltage-to-frequency converter wherein a monostable multivibrator is fed by an integrator which periodically activates a switchable current source coupled to the input of the integrator for a finite period of time and at a rate proportional to the level of an input voltage fed to such integrator. The monostable multivibrator includes nonsaturating switching transistors enabling effective operation of the converter over a relatively wide bandwidth. The converter also includes circuitry to temperature compensate the switchable current source enabling such current source to pass a current pulse having substantially the same finite time duration over the range of operating temperatures.

9 Claims, 12 Drawing Figures

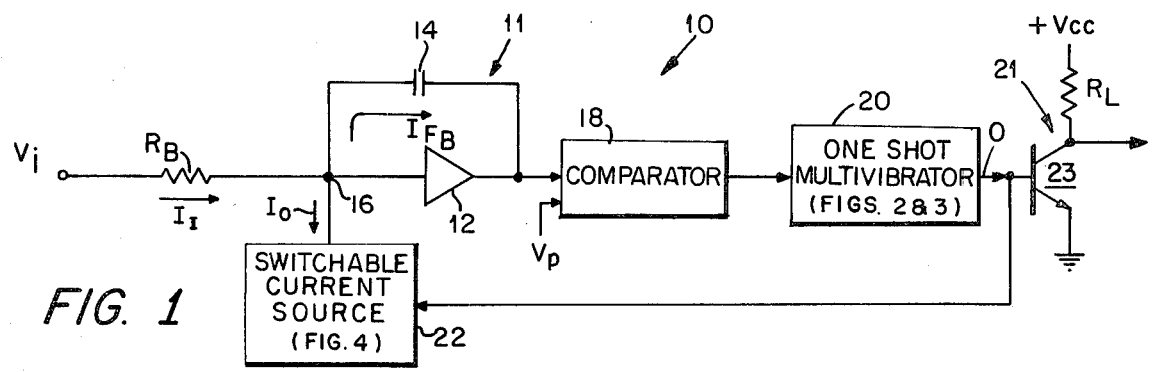
FIG. 1
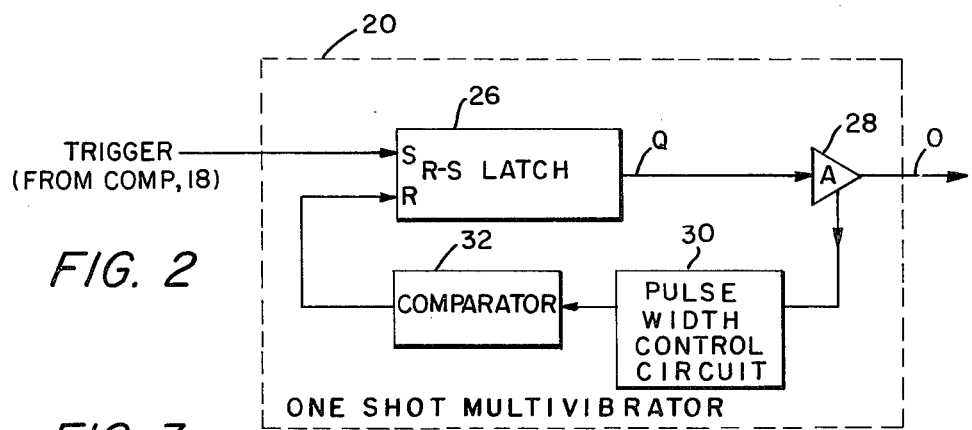
FIG. 2
FIG. 3
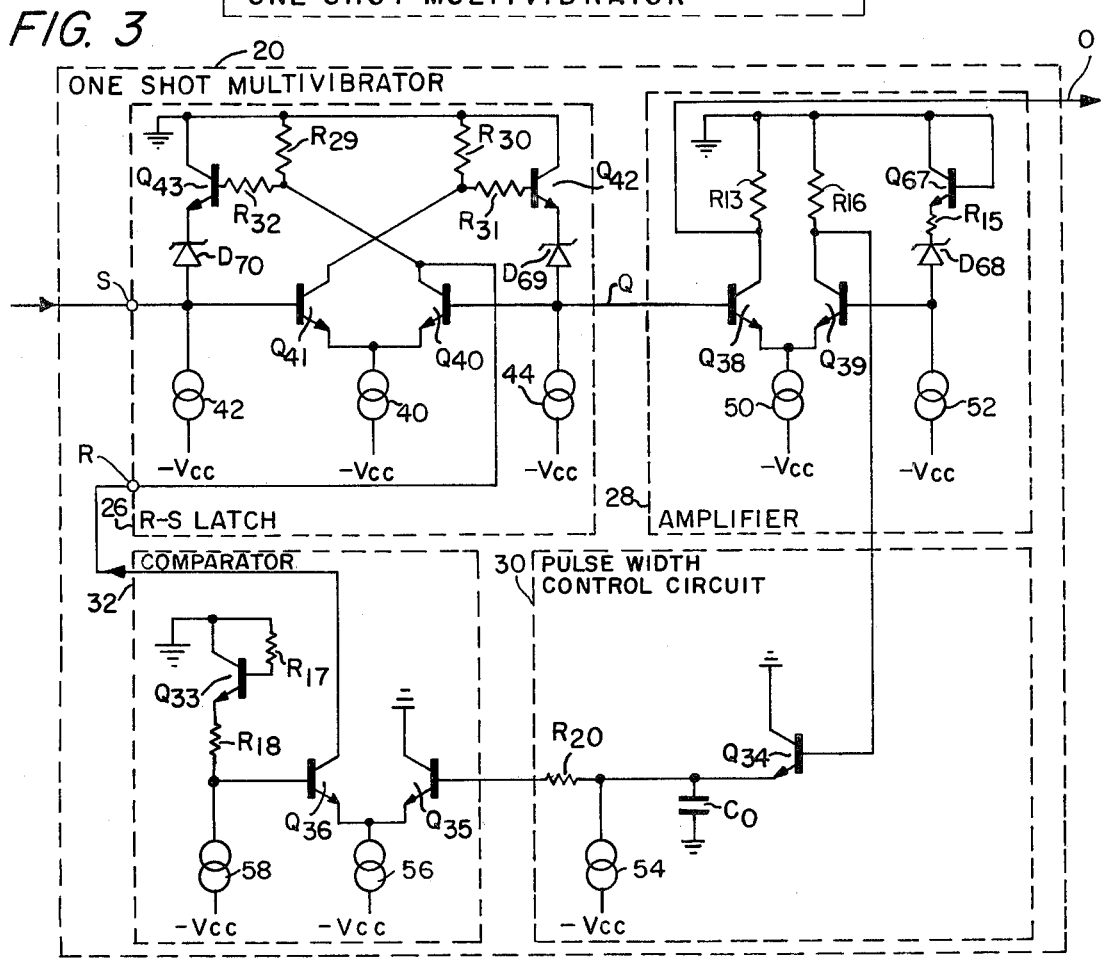

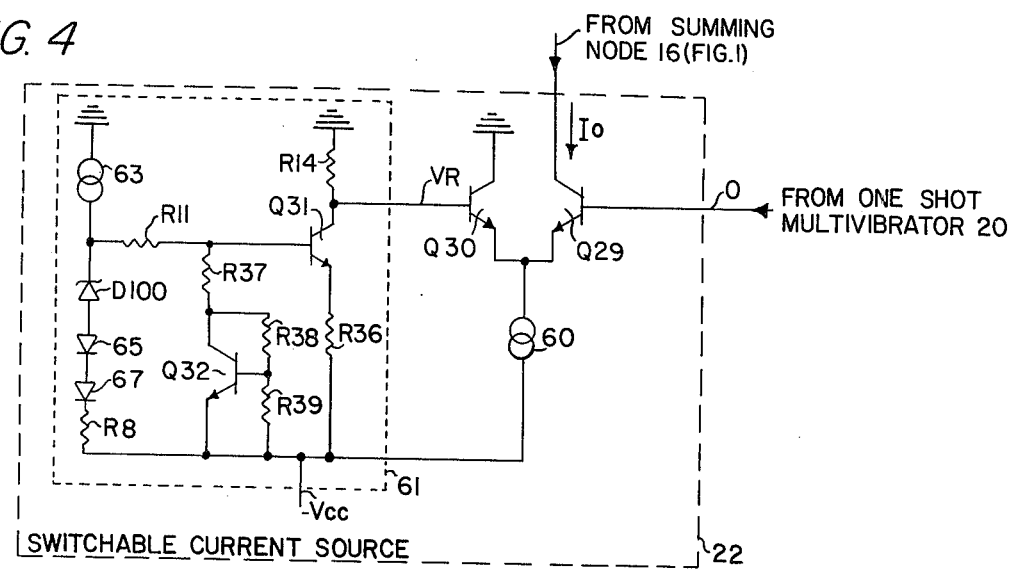
FIG. 4
FIG. 5A TRIGGER SIGNAL (FROM COMP. 18)
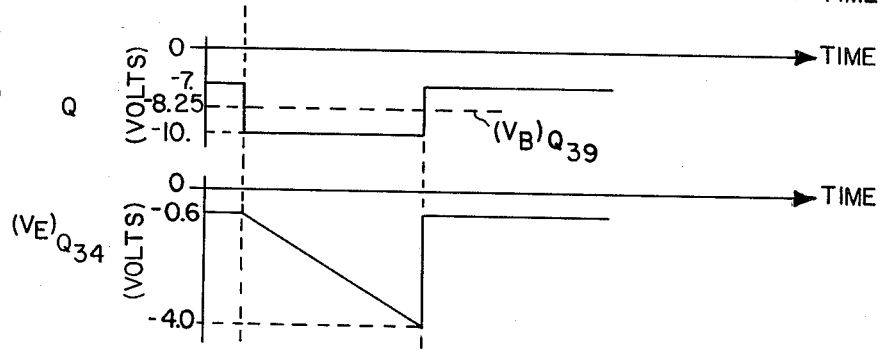
FIG. 5B
FIG. 5C
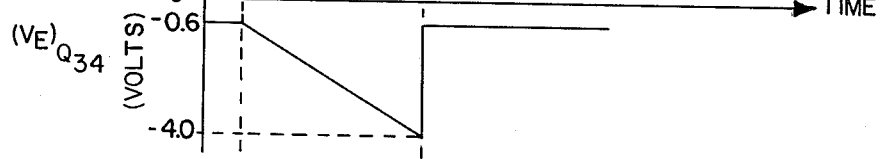
FIG. 5D
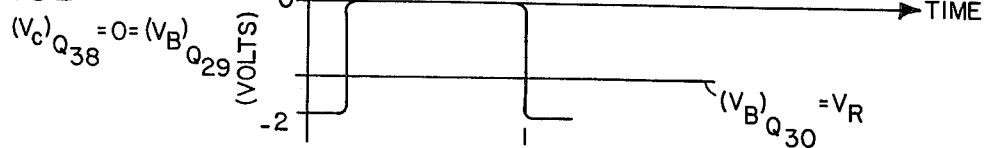
FIG. 5E

MONOSTABLE MULTIVIBRATOR EMPLOYING NONSATURATING SWITCHING TRANSISTOR

BACKGROUND OF THE INVENTION

This invention relates generally to electronic circuitry and more particularly to electronic circuitry adapted for use in voltage-to-frequency converters.

As is known in the art, voltage-to-frequency converters have been used for many years in a variety of applications. One type of voltage-to-frequency converter produces a series of pulses of fixed time duration and height at a rate proportional to the level of an input voltage. In one such type of converter an input current proportional to the level of the input voltage being converted is fed to the input summing mode of an integrator, causing the output of the converter to ramp, say negatively. When the output of the integrator reaches a trigger threshold level a one shot (monostable) multivibrator is activated to couple a constant current source to the input summing node of the integrator for a fixed period of time, thereby causing the integrator output voltage to ramp, positively, at a rate proportional to the difference between the level of the input current and the level of the current supplied by the constant current source. In the steady state mode the one shot multivibrator is triggered at a rate proportional to the level of the input current and hence to the level of the input voltage. The output of the one shot multivibrator is coupled to output circuitry for producing a series of pulses fixed in time duration and amplitude having a rate proportional to the level of the input voltage.

In order for the converter to operate accurately over a relatively wide bandwith, say in the order of 100 KHz or greater, it is necessary that the one shot multivibrator have relatively rapid switching characteristics. Further, while one shot multivibrators have been designed using transistor-transistor-logic (TTL) circuitry, transistors used in such circuitry are placed in a saturation condition when conducting and a relatively long time delay results when such transistors are driven or switched to a nonconducting state thereby lengthening the time duration of the current produced by the current source. At relatively high switching rates this relatively long delay becomes a significantly greater percentage of the time duration of the current pulse thereby reducing the effective operating bandwidth of the converter. Still further, the time delay in such TTL circuitry changes with temperature and hence at relatively high frequencies relatively large inaccuracies may result thereby limiting the effective operating bandwidth of the converter.

SUMMARY OF THE INVENTION

With this background of the invention in mind it is therefore an object of this invention to provide an improved voltage-to-frequency converter.

It is another object of this invention to provide a voltage-to-frequency converter adapted to operate over a relatively wide bandwidth and temperature range.

It is another object of this invention to provide an improved one shot multivibrator adapted to switch rapidly in response to trigger signals fed to such multivibrator.

It is another object of this invention to provide an improved one shot multivibrator which includes transistors which operate in nonsaturated conditions during conduction.

It is still a further object of this invention to provide an electronic circuit adapted to produce current pulses of precise time duration over a relatively wide range of temperature.

These and other objects of the invention are attained generally by providing a one shot multivibrator comprising: (a) a bistable circuit means adapted to be placed selectively in either a first stable condition in response to a trigger signal or in a second stable condition in response to a reset signal; (b) a transistor; (c) means for enabling the transistor to be placed in either a conducting state or a nonconducting state selectively in accordance with the stable condition of the bistable circuit means while preventing such transistor from saturation when such transistor is in the conducting state and for enabling a capacitor to charge when such transistor is in one state and to discharge at a predetermined rate when the transistor is in the other state; and (d) means for producing the reset signal when the capacitor discharges to a predetermined level.

With such arrangement the one shot multivibrator operates with essentially current mode (or emitter coupled) nonsaturation logic enabling rapid switching and accurate production of relatively small current pulses.

Further, in order to compensate for variations in the time duration of an output pulse of the one shot multivibrator because of temperature variations electronic circuitry is provided, such circuitry having: (a) means, including a pair of transistors coupled to a current source, a first one of such transistors having a base electrode fed by the output pulse of the one shot multivibrator and a second one of such transistors having a base electrode fed by a reference voltage, for enabling current from the current source to pass through one of the pair of transistors when the level of the output pulse is greater than the reference voltage and for enabling current from the current source to pass through the other one of the pair of transistors when the level of the output pulse is less than the reference voltage; and, (b) means for producing the reference voltage and for varying the level of such reference voltage with variations in temperature enabling a pulse of current to pass from the current source through one of the pair of transistors in response to the output pulse, such current pulse having a time duration substantially invariant with such variations in temperature.

In a preferred embodiment of the invention the reference voltage producing means includes a first transistor arranged as an inverter having its output coupled to the base of one of the pair of transistors to produce the reference voltage. A second transistor is coupled to the base electrode of the first transistor, such transistor having a relatively high beta and being fed current through its collector and emitter electrodes from a current source. A first resistor is connected between the collector and base of the second transistor and a second resistor is connected to the base and emitter of the second transistor. With such arrangement accurate control of the voltage variation at the base electrode of the transistor in the inverter circuit is obtained by proper selection of the first and second resistors. This voltage variation is coupled to the base electrode of one of the pair of transistors through the inverter producing proper variations of the reference voltage with temperature enabling production of a current pulse having a time duration substantially invariant with the variations in temperature.

BRIEF DESCRIPTION OF THE DRAWINGS

The foregoing features of this invention, as well as the invention itself, may be more fully understood from the following detailed description read together with the accompanying drawings, in which:

FIG. 1 is a block diagram of a voltage-to-frequency converter according to the invention;

FIG. 2 is a block diagram of a one shot multivibrator used in the voltage-to-frequency converter of FIG. 1;

FIG. 3 is a schematic diagram of the one shot multivibrator of FIG. 2;

FIG. 4 is a schematic diagram of a switchable current source used in the voltage-to-frequency converter of FIG. 1;

FIGS. 5A–5E are diagrams useful in understanding the operation of the voltage-to-frequency converter of FIG. 1.

DESCRIPTION OF THE PREFERRED EMBODIMENT

Figure 6A:
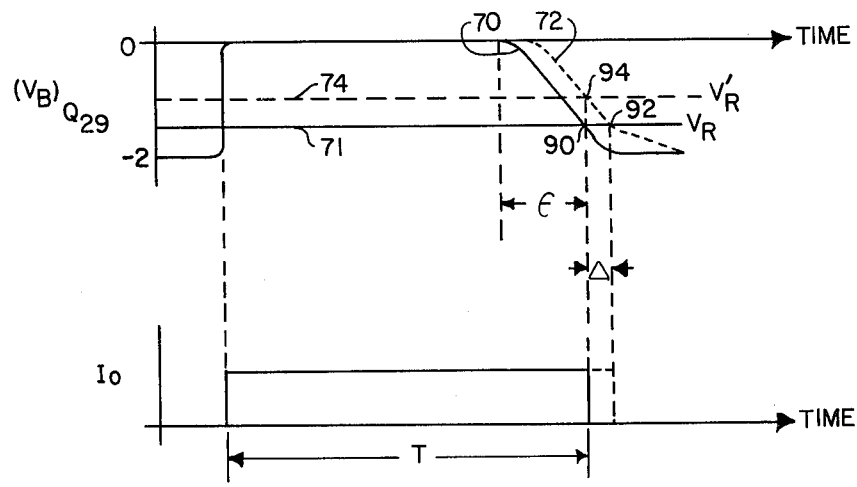
FIGS. 6A–6C are diagrams useful in understanding the operation of the one shot multivibrator and the switchable current source of FIGS. 3 and 4.

Referring now to FIG. 1, a voltage-to-frequency converter 10 is shown to include an integrator 11 madeup in a conventional manner with an operational amplifier 12 and a capacitor 14 coupled between the input of such amplifier 12 and an input summing node 16, as shown. An input voltage $V_i$ is fed to such input summing node 16 through an input resistor $R_B$, as shown. When such voltage $V_i$ is applied to the converter 10 a feedback current $I_{FB}$ is produced through the capacitor 14 equal to the input current $I_I$ produced through the input resistor $R_B$. The input current $I_I$ is proportional to the input voltage $V_i$. If the input voltage is, say, positive the output of the integrator 11 ramps negatively (since the gain of amplifier 12 is negative) to produce negative or regenerative feedback. When the level of the voltage produced at the output of integrator 11 reaches a predetermined level, here $V_P$, a trigger pulse as shown in FIG. 5A is produced at the output of comparator 18 (here a conventional differential amplifier made up of current mode (or emitter coupled) logic circuits). Such trigger signal activates a one shot (monostable) multivibrator 20 (FIG. 1), the details of which will be described in connection with FIGS. 2 and 3. Suffice it to say here, however, that in response to the trigger signal produced by comparator 18 a pluse of predetermined time duration, here T seconds, is produced at the output, O, of the one shot multivibrator 20 as shown in FIG. 5D. In response to such pulse a switchable current source 22 (the details of which will be described in connection with FIG. 4) is activated to enable a predetermined level of current, here $I_O$ (as shown in FIG. 5E), to pass thereto from the input summing node 16 (FIG. 1). It follows then that when the switchable current source 22 is activated, $I_I - I_O = I_{FB}$. Consequently, during the time duration, T, the feedback current $I_{FB}$ is reduced by the predetermined amount $I_O$ and the voltage at the output of integrator 11 now ramps positively by an amount of voltage proportional to the difference in the level of the input current and the predetermined level of current fed to the current source 22, i.e. an amount proportional to $(I_I - I_O)$. When the current source 22 is deactivated by the output, O, of the one shot multivibrator 20 the output of integrator 12 ramps negatively and a trigger signal is again produced when such output reaches the predetermined level $V_P$, repeating the process described. In the steady state mode the rate at which trigger signals are produced is proportional to the level of the input voltage $V_i$. Consequently, the rate of pulses produced at the output, O, of the one shot multivibrator 20 is proportional to the level of the input voltage $V_i$. The output, O, of multivibrator 20 is fed to a conventional grounded emitter transistor circuit 21 so that the collector electrode of the transistor 23 (which is coupled to $+V_{cc}$ through a load resistor $R_L$, as shown) in such circuit switches between $+V_{cc}$ and substantially ground potential at a rate proportional to the level of the input voltage $V_i$. The collector electrode of transistor 23 thereby provides a series of pulses of fixed time duration and height at a rate proportional to the level of the input voltage $V_i$.

Referring now to FIG. 2, one shot multivibrator 20 is shown to include: A bistable multivibrator or R-S latch 26 having a set terminal S fed by the trigger signal produced by comparator 18 (FIG. 1) in the manner described above and an output terminal Q coupled to an amplifier 28, as shown; a pulse width control circuit 30 fed by the amplifier 28; and a comparator 32 driven by the pulse width control circuit 30 for producing a reset signal to reset the terminal R of the R-S latch 26, as shown.

In operation, in response to the trigger signal the R-S latch 26 is placed in a set condition causing the output Q of the R-S latch to go low and the output of amplifier 28, i.e. the output O of one shot multivibrator 20, to go high, thereby activating the pulse width control circuit 30. When so activated a ramp-shaped output voltage is produced by the pulse width control circuit 30, related to the particular values of components used in such circuit 30 as will be described in detail in connection with FIG. 3. Suffice it to say here, however, that when the level of the output voltage produced by the pulse width control circuit 30 reaches a predetermined threshold voltage produced in comparator 32 in a manner to be described in connection with FIG. 3, the comparator 32 produces a reset signal to reset terminal R of R-S latch 26, placing such latch 26 in a reset condition. Here the output of the pulse control circuit 30 and the predetermined threshold voltage are selected so that such threshold voltage is reached a time duration T after the R-S latch 26 is placed in a set condition. When reset the output Q of the R-S latch 26 goes high and the output O of the multivibrator 20 goes low completing the pulse formed by the multivibrator 20 in response to the trigger signal.

Referring now to FIG. 3, the details of the one shot multivibrator 20 are shown. It is first pointed out that the R-S latch 26, amplifier 28, pulse width control circuit 30 and comparator 32 include nonsaturating transistors and hence such multivibrator 20 may be considered as being made up of non-saturation logic, sometimes referred to as emitter-coupled-logic (ECL) or current mode logic (CML). That is, when such transistors are in a conducting state the collector-base junctions of such transistors are reverse biased. Such nonsaturating logic therefore removes the relatively long time delay characteristic associated with switching a saturated transistor out of saturation (i.e. when the collector-base junction of such transistor is forward biased). This enables the one shot multivibrator 20 to operate at relatively higher speeds and thereby enables the voltage-to-frequency converter to operate effectively over a relatively wide bandwidth. As shown, the R-S latch 26 includes a pair of transistors, $Q_{40}$, $Q_{41}$ having emitter electrodes connected to a $-V_{cc}$ voltage supply through a constant current source 40, as shown. Current source 40 may be of any conventional design, here designed to carry 0.25 ma of current. The base electrode of transistor 40 is coupled to the collector electrode of transistor $Q_{41}$ through a Zener diode $D_{69}$, the base-emitter junction of transistor $Q_{42}$ and a resistor $R_{31}$, as shown. Similarly, the base electrode of transistor $Q_{41}$ is coupled to the collector electrode of transistor $Q_{40}$ through a Zener diode $D_{70}$, a resistor $R_{32}$ and the base-emitter junction of transistor $Q_{43}$, as shown.

Biasing resistors $R_{29}$, $R_{32}$ are provided, as shown, for transistor $Q_{43}$, the collector of such transistor being connected to ground and the base electrode of such transistor $Q_{43}$ being coupled to: The collector electrode of transistor $Q_{40}$ through resistor $R_{32}$; and ground through resistors $R_{32}$, $R_{29}$ as shown. Resistor $R_{29}$ is here 12 Kohms. Likewise, biasing resistors $R_{30}$, $R_{31}$ are provided, as shown, for transistors $Q_{42}$. The collector electrode of transistor $Q_{42}$ is connected to ground. The base electrode of transistor $Q_{42}$ is connected to the collector electrode of transistor $Q_{41}$ through resistor $R_{31}$ and to ground through resistors $R_{30}$, $R_{31}$, as shown. Resistor $R_{30}$ is here 12 Kohms. The base electrode of transistor $Q_{41}$ is connected to a current source 42 and is also connected to set terminal S. The base electrode of transistor $Q_{40}$ provides the output of the R-S latch 26 at terminal Q, as shown, and such base electrode of transistor $Q_{40}$ is coupled to $-V_{cc}$ through a current source 44, as shown.

In operation when a positive trigger signal is temporarily fed to the set terminal S from comparator 18 (FIG. 1) as shown in FIG. 5A, transistor $Q_{41}$ conducts current passing from ground through resistor $R_{30}$, the collector and emitter electrodes of transistor $Q_{41}$ and current source 40 to $-V_{cc}$. This current flow reduces the voltage at the base electrode of transistor $Q_{42}$ and establishes a fixed voltage of here $-10.0$ volts at the base electrode of transistor $Q_{40}$ and hence at terminal Q as shown in FIG. 5B. The $-10.0$ volts at the base electrode of transistor $Q_{40}$ prevents such transistor from conducting current. Zener diode $D_{70}$ breaks down and a fixed voltage of here $-7.0$ volts is established at the base electrode of transistor $Q_{41}$, placing the R-S latch 26 in a "set" condition. In such set condition transistor $Q_{41}$ is in a conducting state and the collector electrode thereof passes here 0.25 mA. Further, because resistor $R_{30}$ is here 12 Kohms the voltage at the collector electrode of transistor $Q_{41}$ is in the order of $-3.0$ volts. Therefore, when transistor $Q_{41}$ is conducting such transistor is not in saturation because the collector-base junction is reverse biased (i.e. the voltage of the base electrode of conducting transistor $Q_{41}$ is $-7.0$ volts and at the collector electrode is $-3.0$ volts).

Amplifier 28 is fed by the voltage produced at the output Q of the R-S latch 26, as shown. Such amplifier 28 includes a pair of transistors $Q_{38}$, $Q_{39}$ having emitter electrodes connected to $-V_{cc}$ through a current source 50, here a 0.2 mA current source, as shown. The base electrode of transistor $Q_{39}$ is connected: (a) to ground through a Zener diode $D_{68}$, a resistor $R_{15}$ and a diode connected transistor $Q_{67}$, as shown, and (b) to $-V_{cc}$ through a current source 52, as shown. The current source 52, Zener diode $D_{68}$, resistor $R_{15}$ and transistor $Q_{67}$ provide a reference voltage of here $-8.25$ volts at the base electrode of transistor $Q_{39}$ i.e. $(V_B)Q_{39} = -8.25$ volts). It is noted that the Zener diodes $D_{69}$, $D_{68}$ and transistors $Q_{42}$, $Q_{67}$ are "matched" as by forming such transistors as integrated circuit components on a common semiconductor substrate so that temperature variations which in turn produce voltage variations at the base electrode of transistor $Q_{40}$ track temperature caused voltage variations at the base electrode of transistor $Q_{39}$, thereby enabling the reference voltage at the base electrode of transistor $Q_{39}$ to track, in temperature, the reference voltage at the base electrode of transistor $Q_{40}$.

The collector electrodes of transistors $Q_{38}$, $Q_{39}$ are connected to ground through resistors $R_{13}$, $R_{16}$ as shown ($R_{13} = 10$ Kohms and $R_{16} = 25$ Kohms). The collector electrode of transistor $Q_{38}$ provides the output O of the one shot multivibrator 20. The amplifier 28 drives the pulse width control circuit 30. As discussed above, when the R-S latch 26 is in a set condition the voltage at the output Q of such latch 26 is here $-10$ volts. As will be discussed, when such latch 26 is in a reset condition the voltage at output Q is here $-7.0$ volts. Amplifier 28 shifts the levels of such voltages at output Q from $-10$ volts and $-7.0$ volts to here 0.0 volts and $-5.0$ volts, respectively, at the collector of transistor $Q_{39}$. In operation when the voltage at the output Q is $-10$ volts (i.e. the R-S latch 26 is in a set condition) the base electrode of transistor $Q_{38}$ is more negative than the $-8.25$ reference voltage at the base electrode of transistor $Q_{39}$ (i.e. $(V_B)Q_{39} = -8.25$ volts) so that current passes through the current source 50 and the emitter-collector electrodes of transistor $Q_{39}$ producing a negative voltage, here $-5.0$ volts; at the collector electrode of transistor $Q_{39}$, i.e. $(V_C)Q_{39} = -5.0$ volts, and a voltage at the collector electrode of transistor $Q_{38}$ (i.e. $(V_C)Q_{38}$) (and hence at the output O of the one shot multivibrator 20) of 0 volts as shown in FIG. 5D. Conversely, as will be shown when the output Q is $-7.0$ volts, (as when the R-S latch 26 is in the reset condition), the base electrode of transistor $Q_{38}$ is more positive than the $-8.25$ volts at the base electrode of transistor $Q_{39}$ so that current is passed through current source 50 and the collector and emitter electrodes of transistor $Q_{38}$, thereby placing the collector electrode of transistor $Q_{38}$ at here $-2.0$ volts (i.e. $(V_C)Q_{38} = -2.0$ volts) and producing zero volts at the collector electrode of transistor $Q_{39}$ (i.e. $(V_C)Q_{39} = 0.0$ volts). It is to be noted that the amplifier 28 includes emitter coupled logic since neither one of the transistors $Q_{38}$ or $Q_{39}$ is in saturation when conducting.

Pulse width control circuit 30 includes a transistor $Q_{34}$ having a base electrode connected to the collector electrode of transistor $Q_{39}$, a collector electrode connected to ground and an emitter electrode connected to: a capacitor $C_o$; $-V_{cc}$ through a current source 54; and comparator 32 through resistor $R_{20}$, as shown. It is first noted that, as discussed above, the voltage variation at the collector electrode of transistor $Q_{39}$ and hence the voltage at the base electrode of transistor $Q_{34}$ (i.e. $(V_B)Q_{34}$) is 0.0 volts to $-5.0$ volts. Further, the collector electrode of transistor $Q_{34}$ is at ground potential. Therefore, the base-collector junction of transistor $Q_{34}$ is reverse biased and hence nonsaturating when in a conducting state.

In operation, when the R-S latch 26 is placed in a set condition by the trigger signal, amplifier 28 produces a $-5.0$ volt signal at the base electrode of transistor $Q_{34}$, rapidly driving such transistor $Q_{34}$ to a nonconducting state. Current in the current 54 passes through capacitor $C_o$ to ground, linearly charging the capacitor $C_o$ and thereby linearly increasing (in a negative sense) the voltage at the emitter electrode of transistor $Q_{34}$ (i.e. $(V_E)Q_{34}$) from an initial level of here $-0.6$ volts as shown in FIG. 5C. The signal produced at the emitter electrode of transistor $Q_{34}$ is fed to comparator 32 through a resistor $R_{20}$, as shown.

Comparator 32 includes a pair of transistors $Q_{35}$, $Q_{36}$, such transistors having emitter electrodes connected to $-V_{cc}$ through a current source 56, as shown. The base electrode of transistor $Q_{36}$ is coupled to ground through a resistor $R_{18}$ and a transistor $Q_{33}$ (such transistor $Q_{33}$ having a resistor $R_{17}$ connected between its base and collector electrodes), as shown, and to $-V_{cc}$ through a current source 58, as shown, all arranged to produce a reference voltage, here $-4.0$ volts, at the base electrode of transistor $Q_{36}$. The collector electrode of transistor $Q_{35}$ is connected to ground and the base electrode thereof is coupled to the pulse width control current 30, as shown. The collector electrode of transistor $Q_{36}$ provides the output for comparator 32 and is connected to the reset terminal R of the R-S latch 26, as shown.

In operation, after the R-S latch 26 has been placed in a set condition by the trigger pulse at the set terminal S the $-5$ volts at the base electrode of transistor $Q_{34}$ rapidly places such transistor $Q_{34}$ in a nonconducting state to enable the voltage at the emitter electrode thereof, (i.e. $(V_E)Q_{34}$) to linearly increase, in a negative sense, at a rate related to the value of the capacitor $C_o$ as such capacitor $C_o$ is charged from the current source 54 as shown in FIG. 5C. The voltage $(V_E)Q_{34}$ is fed to the base electrode of transistor $Q_{35}$ and when the level of the voltage $(V_E)Q_{34}$ reaches the reference voltage $V_R$, here $-4.0$ volts, (fed to the base electrode of transistor $Q_{36}$), transistor $Q_{35}$, which was initially conducting, goes to a nonconducting state and the current to current source 56 passes thereto from the collector electrode of transistor $Q_{36}$. This lowers the voltage at the collector electrode of transistor $Q_{40}$ of the R-S latch 26 causing transistor $Q_{43}$ to become nonconducting, transistor $Q_{40}$ to become conducting and transistor $Q_{41}$ to become nonconducting, placing the R-S latch 26 in its reset state. In such reset state transistor $Q_{42}$ is conducting thereby enabling a reference voltage of here $-7.0$ volts to be established at the output Q of the R-S latch 26 as shown in FIG. 5B. This $-7.0$ volts is shifted to a zero volt signal at the base electrode of transistor $Q_{34}$, placing such transistor $Q_{34}$ in a conducting state to supply current to the constant current source 54. When transistor $Q_{34}$ conducts, the voltage at the emitter electrode thereof (i.e. $(V_E)Q_{34}$) returns to here $-0.6$ volts as shown in FIG. 5C, thereby completing operation of the one shot multivibrator 20. That is, in response to a trigger signal at the set terminal S a pulse is produced at the output O of one shot multivibrator 20 of time duration T, such time duration being related to the value of capacitor $C_o$ as shown in FIG. 5D.

It is again noted that neither transistor $Q_{34}$ nor transistor $Q_{35}$ have forward biased base-collector junctions during conduction so that the entire one shot multivibrator 20 is made up of nonsaturating or emitter-coupled-logic enabling rapid switching and effective operation of the voltage-to-frequency connector over a relatively wide bandwidth.

Referring now to FIG. 4, switchable current source 22 is shown to include a pair of transistors $Q_{29}$, $Q_{30}$ having emitter electrodes coupled to $-V_{cc}$ through a constant current source 60, as shown. The collector electrode of transistor $Q_{29}$ is connected to the input summing node 16 of integrator 11 (FIG. 1) and passes through such collector electrode the current $I_o$. The base electrode of transistor $Q_{29}$ is connected to the output, O, of one shot multivibrator 20 (FIG. 1) and in particular to the collector electrode of transistor $Q_{38}$ (FIG. 3). The collector electrode of transistor $Q_{30}$ is connected to ground, as shown. A reference voltage $V_R$ is established at the base electrode of transistor $Q_{30}$ by a reference voltage circuit 61, as shown.

As discussed above, when the R-S latch 26 (FIG. 3) is placed in a set condition by the trigger pulse fed to set terminal S the voltage at the collector electrode of transistor $Q_{38}$ (i.e. $(V_c)Q_{38}$) goes to ground as shown in FIG. 5D, likewise since $(V_c)Q_{38}=(V_B)Q_{29}$, the voltage at the base electrode of transistor $Q_{29}$ goes to ground. Since the voltage on the base electrode of transistor $Q_{29}$ (i.e. $(V_B)Q_{39}$) is more positive than the reference voltage $V_R$ at the base electrode of transistor $Q_{30}$ (i.e. $(V_B)Q_{30}=V_R$), transistor $Q_{29}$ conducts the current $I_o$ through its emitter and collector electrodes as shown in FIG. 5E. When the R-S latch 26 (FIG. 3) is reset, the voltage at the collector electrode of transistor $Q_{38}$ and hence at the base electrode of transistor $Q_{29}$ (i.e. $(V_B)Q_{29}$) goes to $-2.0$ volts as shown in FIG. 5D. When the voltage at the base electrode of transistor $Q_{29}$ goes more negative than the reference voltage $V_R$ at the base electrode of transistor $Q_{30}$, transistor $Q_{29}$ becomes nonconducting, thereby terminating flow from the summing node 16 (FIG. 1) as shown in FIG. 5E. It is noted that transistors $Q_{29}$ and $Q_{30}$ have reversed biased base-collector junctions when conducting and hence are not in saturation when conducting.

Figure 6B:
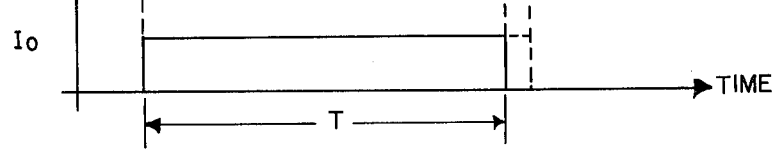
Figure 6C:
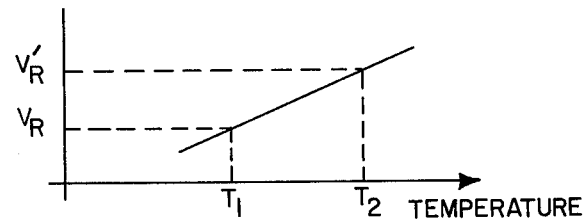

Referring now to FIG. 6A, the voltage at the base electrode of transistor $Q_{29}$ $((V_B)Q_{29})$ as a function of time is shown by solid curve 70 in more detail. As noted, there is a finite time delay $\epsilon$ in such voltage changing from ground to the reference voltage $V_R$ (solid curve 71) at the base electrode of transistor $Q_{30}$, $((V_B)Q_{30})$ (FIG. 4). While such delay $\epsilon$ is significantly smaller than delays associated with saturating transistors the temperature variation of such delay $\epsilon$, here approximately 20 ns, is here compensated by the reference voltage circuit 61 shown in FIG. 4. That is, if at the lowest operating temperature $T_1$ the voltage at the base electrode of transistor $Q_{29}$ is as shown by solid curve 70 in FIG. 6A a current pulse of $I_o$ is passed through the collector electrode thereof for a time interval T as shown in FIG. 6B because transistor $Q_{29}$ switches when the voltage on the base electrode thereof reaches switching point 90 (FIG. 6A). If temperature now increases to the highest operating temperature $T_2$ the voltage-time history of the voltage at the base electrode of transistor $Q_{29}$ is as shown by the dotted curve 72 in FIG. 6A and the delay $\epsilon$ increases an amount $\Delta$, here 5 ns, as shown, thereby increasing the time duration of the current pulse as shown in FIG. 6B if the reference voltage $V_R$ at the base electrode of transistor $Q_{30}$ remains invariant with temperature thereby adversely affecting the accuracy of the converter. That is, at temperature $T_2$ if the voltage at the base electrode of transistor $Q_{30}$ remained at the reference voltage level $V_R$, transistor $Q_{29}$ would switch when the voltage on the base electrode thereof reached switching point 92 (FIG. 6A), increasing the current pulse time duration an amount $\Delta$, that is from a time duration T to a time duration $T+\Delta$. As will be described, the reference voltage circuit 61 shown in FIG. 4 increases the reference voltage $V_R$ at the base electrode of transistor $Q_{30}$ from a reference voltage $V_R$ at the base electrode of transistor $Q_{30}$ to a reference voltage $V_R'$ when operating at the temperature $T_2$ as shown in FIG. 6C. In particular, referring to FIG. 6A, it is noted that when operating at temperature $T_2$ and a reference voltage of $V_R' = (V_B)Q_{30}$ (dotted curve 74) the base voltage of transistor $Q_{29}$ (as shown by dotted curve 72) passes through such voltage $V_R'$ at switching point 94, hence with the delay $\epsilon$ and $\Delta = 0$. That is, the delay $\epsilon$ is now made invariant with temperature over the operating temperature $T_2$ to $T_1$, (here $-55°$ C. to $125°$ C.) and the current pulse $I_o$ therefore has a time duration T which is substantially invariant with temperature as shown in FIG. 6B.

Referring again to FIG. 4, the reference voltage circuit 61 is shown to include a transistor $Q_{32}$ having: An emitter electrode connected to $-V_{cc}$; a collector electrode connected to the base electrode of transistor $Q_{31}$ through a resistor $R_{37}$; and a base electrode connected to $-V_{cc}$ through resistor $R_{39}$ and to the collector electrode of transistor $Q_{32}$ through resistor $R_{38}$, as shown. Transistor $Q_{32}$ has a relatively high beta and hence the base current in such transistor may be regarded as insignificant. Therefore, the current passing through resistor $R_{38}$ is essentially the same as the current passing through resistor $R_{39}$, $$\Delta V/(R_{38}+R_{39}) = \Delta V_{BE}/R_{39} \qquad \text{Eq. (1)}$$

or, rewriting Eq. (1), $$\Delta V = [(R_{38}/R_{39}) + 1]\Delta V_{BE} \qquad \text{Eq. (2)}$$

where
$\Delta V$ is the voltage variation, with temperature, at the collector electrode of transistor $Q_{32}$; and
$\Delta V_{BE}$ is the voltage variation, across the base-emitter junction of either transistor $Q_{31}$ or transistor $Q_{32}$ here in the order of $-2$ mV/° C.

The voltage-temperature characteristics of resistors $R_{37}$, $R_{36}$ are here matched, as by forming such resistors as integrated circuit components on a common semiconductor substrate, and consequently the voltage variation at the base electrode of transistor $Q_{31}$ (i.e. $(\Delta V_B)Q_{31}$) is also $\Delta V$ as given by Eq. (2). The voltage variation, $\Delta V$, at the base electrode of transistor $Q_{31}$ causes a corresponding voltage variation at the collector electrode of transistor $Q_{31}$, here $\Delta V_R$, and hence a corresponding variation to the reference voltage at the base electrode of transistor $Q_{30}$. It is noted, however, that the polarity of the voltage variation $\Delta V$ is inverted by transistor $Q_{31}$ since such transistor is connected as an inverter. Further, the voltage variation $\Delta V_R$ is the voltage at the emitter electrode of transistor $Q_{31}$ (i.e. $\Delta V_1$) scaled by the ratio K of the emitter and base resistances $R_{14}$, $R_{36}$ of transistor $Q_{31}$ (i.e. $K = R_{14}/R_{36}$). The voltage at the emitter electrode of transistor $Q_{31}$ is $\Delta V_1$. Further, $\Delta V_1$ equals $(\Delta V - \Delta V_{BE}) = [(R_{38}/R_{39}) + 1]\Delta V_{BE} - \Delta V_{BE} = (R_{38}/R_{39}) \Delta V_{BE}$. Therefore, the voltage variation in the voltage of the reference voltage at the base electrode of transistor $Q_{30}$, $\Delta V_R$ is:

$$\Delta V_R = -K\Delta V_1 = -K(R_{38}/R_{39}) \Delta V_{BE} \qquad \text{Eq. (3)}$$
$$= 2K(R_{38}/R_{39}) \; mV/°C.$$

From Eq. (3) it is noted that the variation in the reference voltage with temperature $\Delta V_R$, may be selected by appropriate selection of the values of resistors $R_{38}$, $R_{39}$ and $K = R_{14}/R_{36}$. In particular, such values of resistors $R_{14}$, $R_{36}$, $R_{38}$, $R_{39}$ are selected to change the reference voltage from $V_R$ at a temperature $T_1$ to $V_R'$ at a temperature $T_2$, as shown in FIG. 6C, to enable the voltage at the base electrode of transistor $Q_{29}$ to pass through the voltage $V_R$ after the time delay $\epsilon$ when operating at temperature $T_1$ and to pass through voltage $V_R'$ after the time delay $\epsilon$ when operating at temperature $T_2$, thereby producing a current pulse of $I_o$ for the time duration substantially independently of the operating temperature. Here the value of resistor $R_{38}$ is equal to the value of resistor $R_{39}$ and $K = R_{14}/R_{36} = 6.05$ Kohms/5.2 Kohms producing in the order of $\approx 2.4$ mV/° C. variation in the reference voltage of the base electrode of transistor $Q_{30}$. Completing the reference voltage circuit 61 (FIG. 4) the base electrode of transistor $Q_{31}$ is coupled to $-V_{cc}$ through, inter ohm, a resistor $R_{11}$, Zener diode $D_{100}$, diodes 65, 67 and resistor $R_8$, as shown and to ground through current source 63 and and resistor $R_{11}$.

Having described a preferred embodiment of this invention, it is now evident that other embodiments incorporating its concepts may be used. It is felt, therefore, that this invention should not be restricted to the disclosed embodiment, but rather should be limited only by the spirit and scope of the appended claims.

What is claimed is:
1. A one shot multivibrator, comprising:
   (a) a bistable circuit means adapted to be placed selectively in either a first stable condition in response to a trigger signal or in a second stable condition in response to a reset signal;
   (b) a transistor;
   (c) means for enabling the transistor to be placed in either a conducting state or a nonconducting state selectively in accordance with the stable condition of the bistable circuit means while preventing forward-biasing of a base-collector junction of such transistor when such transistor is in the conducting state and for enabling a capacitor to discharge when such transistor is in one state and to charge at a predetermined rate when the transistor is in the other state; and
   (d) means for producing the reset signal when the capacitor charges to a predetermined level.

2. The one shot multivibrator recited in claim 1 wherein the bistable circuit means includes a bistable multivibrator.

3. The one shot multivibrator recited in claim 2 wherein the bistable multivibrator includes a pair of transistors and circuit means for preventing a conductive one of such pair of transistors from saturation.

4. The one shot multivibrator recited in claim 1 including temperature compensating circuitry comprising:
   (a) means, including a pair of transistors coupled to a current source, a first one of such transistors having a base electrode fed by an output pulse of the one shot multivibrator and a second one of such transistors having a base electrode fed by a reference voltage, for enabling current from the current source to pass through one of the pair of transistors when the level of the output pulse is greater than the reference voltage and for enabling current from the current source to pass through the other one of the pair of transistors when the level of the output pulse is less than the reference voltage; and (b) means for producing the reference voltage and for varying the level of such reference voltage with variations in temperature enabling a pulse of current to pass from the current source through one of the pair of transistors in response to the output pulse, such current pulse having a time duration substantially invariant with variations in temperature.

5. A one shot multivibrator, comprising:
(a) a bistable circuit means adapted to be placed selectively in either a first stable condition in response to a trigger signal or in a second stable condition in response to a reset signal;
(b) a transistor;
(c) a capacitor coupled to an emitter electrode of the transistor;
(d) means for biasing the transistor in either a conducting state or a non-conducting state selectively in accordance with the stable condition of the bistable circuit means and for preventing forward biasing of a base-collector junction of the transistor when such transistor is in the conducting state to prevent such transistor from saturation when conducting and for enabling the capacitor to charge when such transistor is in the non-conducting state and to discharge when such transistor is in the conducting state; and
(e) means for producing the reset signal when the capacitor charges to a predetermined level.

6. A one shot multivibrator, comprising:
(a) a bistable multivibrator having a set input, a reset input, and an output;
(b) a transistor having a collector electrode connected to a reference voltage source and a base electrode coupled to the output of the bistable multivibrator;
(c) a capacitor coupled to an emitter electrode of the transistor;
(d) means for biasing the transistor to a non-conducting condition in response to a set signal fed to the set input and for biasing the transistor to a conducting condition while preventing forward biasing of a collector-base junction of the transistor in response to a reset signal fed to the reset input;
(e) means for charging the capacitor when the transistor is in the non-conducting condition; and
(f) means coupled to an electrode of the capacitor for producing the reset signal when the capacitor charges to a predetermined level.

7. A one shot multivibrator comprising:
(a) a bistable multivibrator having a set input, a reset input, and an output;
(b) a pair of transistors: a first one thereof having a base electrode connected to the output of the bistable multivibrator, an emitter electrode coupled to a current source, and a collector electrode coupled to a reference voltage source through a first resistor; and a second one of the pair of transistors having a base electrode coupled to a reference voltage source, an emitter electrode coupled to the emitter electrode of the first one of the pair of transistors and to the current source, and a collector electrode coupled to a reference voltage source through a second resistor;
(c) a switching transistor having a collector electrode connected to a reference voltage source and a base electrode connected to the collector electrode of the second one of the pair of transistors;
(d) a capacitor having a first electrode coupled to an emitter electrode of the switching transistor;
(e) means coupled to the first electrode of the capacitor for supplying charge to the capacitor; and
(f) means, having: a first input coupled to the first electrode of the capacitor; a second input coupled to a reference voltage source; and an output coupled to the reset input of the bistable multivibrator, for producing a reset signal to the reset input of the bistable multivibrator in response to signals at the first and second inputs.

8. The one shot multivibrator recited in claim 7 including additionally:
(a) means, including a second pair of transistors having emitter electrodes coupled to a second current source, a first one of the second pair of transistors having a base electrode coupled to the collector electrode of the first one of the first pair of transistors for producing a pulse at the base electrode of the first one of the second pair of transistors having a voltage level which changes from a first level to a second level in a time interval having a time duration related to temperature; and
(b) a voltage reference source means, coupled to the base electrode of the second one of the second pair of transistors, for producing a reference voltage at the base electrode of the second one of the second pair of transistors and for varying the level of such reference voltage with variations in temperature, such variations being in accordance with temperature variations in the time duration in the voltage level of the pulse produced at the base electrode of the first one of the second pair of transistors changing from the first level to the second level.

9. A one shot multivibrator, comprising:
(a) a bistable multivibrator having a set signal, a reset input and an output;
(b) a transistor having a base electrode coupled to the output of the bistable multivibrator;
(c) a capacitor coupled to the transistor;
(d) means for biasing the transistor to a non-conducting state in response to a set signal fed to the set input and for biasing such transistor to a conducting state while preventing forward biasing of a collector-base junction of the transistor in response to a reset signal fed to the reset input;
(e) means for supplying charge to the capacitor when the transistor is in the nonconducting state;
(f) means for producing the reset signal when the capacitor charges to a predetermined level changing a voltage at an output of the one shot multivibrator from a first state to a second state, the time interval in changing from such first state to such second state varying with temperature over a range of temperatures;
(g) means, including a pair of transistors coupled to a current source, a first one of such transistors having a base electrode fed by the output of the one shot multivibrator and a second one of such transistors having a base electrode fed by a reference voltage source, for enabling current from the current source to pass through one of the pair of transistors when a voltage at the output of the one shot multivibrator is greater than the reference voltage and for enabling current from the current source to pass through the other one of the pair of transistors when the voltage at the output of the one shot multivibrator is less than the reference voltage; and
(h) means for producing the reference voltage and for varying the level of such reference voltage with temperature in accordance with the temperature variation in the time interval in the voltage at the output of the one shot multivibrator switching from the first state to the second state.

* * * * *

UNITED STATES PATENT OFFICE
CERTIFICATE OF CORRECTION

Patent No. 4,234,806        Dated  November 18, 1980

Inventor(s) James C. Schmoock

It is certified that error appears in the above-identified patent and that said Letters Patent are hereby corrected as shown below:

Column 3, line 31, delete --input-- (first occurrence) and replace with --output--;

Column 3, line 51, delete --pluse-- and replace with --pulse--;

Column 9, line 12, insert --range-- between the words --temperature-- and --$T_2$--;

Column 10, line 20, delete --inter ohm-- and replace with --inter alia--;

Column 11, line 9, insert --the-- between the words --with-- and --variations--.

Signed and Sealed this

Eighth Day of February 1983

[SEAL]

Attest:

Attesting Officer

GERALD J. MOSSINGHOFF

Commissioner of Patents and Trademarks